PHOTOSENSITIVE SOLID STATE RELAY

Filed May 19, 1961

INVENTOR.
RICHARD L. WHITE
BY M. Jabin
ATTORNEY 3,240,943
Patented Mar. 15, 1966

1

3,240,943

PHOTOSENSITIVE SOLID STATE RELAY

Richard L. White, Glendora, Calif., assignor to Hoffman Electronics Corporation, a corporation of California Filed May 19, 1961, Ser. No. 111,390
1 Claim. (Cl. 250—206)

The present invention relates to relays, and more particularly to solid state relays for the switching of electronic signals.

There are many kinds of relays presently in use for the switching of electronic signals, but they contain mechanical moving parts, which wear out and limit the useful life of the relay. In addition, they are noisy and subject to mechanical failure during their normal lifetime.

It is an object of the present invention, therefore, to provide a novel relay.

It is another object of the present invention to provide a solid state relay having no mechanical moving parts.

According to the present invention, a solid state relay comprises an input circuit connected to a lamp, and a contact circuit connected to two back-to-back photovoltaic or solar cells.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
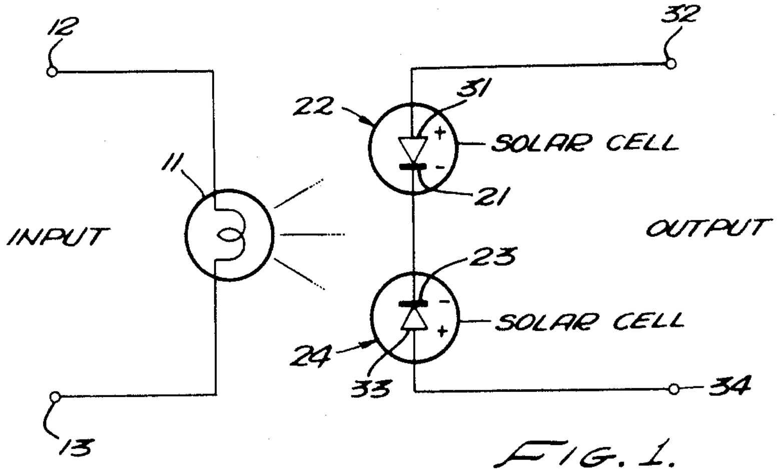
FIGURE 1 is a schematic diagram of a circuit according to the present invention.

Referring now to the drawings, FIGURE 1 shows lamp 11 connected to input terminals 12 and 13. Lamp 11 will light when an input voltage is applied across terminals 12 and 13. Cathode 21 of solar cell 22 is connected to cathode 23 of solar cell 24. Anode 31 of solar cell 22 is connected to output terminal 32, and anode 33 of solar cell 24 is connected to output terminal 34.

Lamp 11 is analogous to the coil circuit of a conventional mechanical relay, and solar cells 22 and 24 are analogous to the contact circuit.

Figure 2:
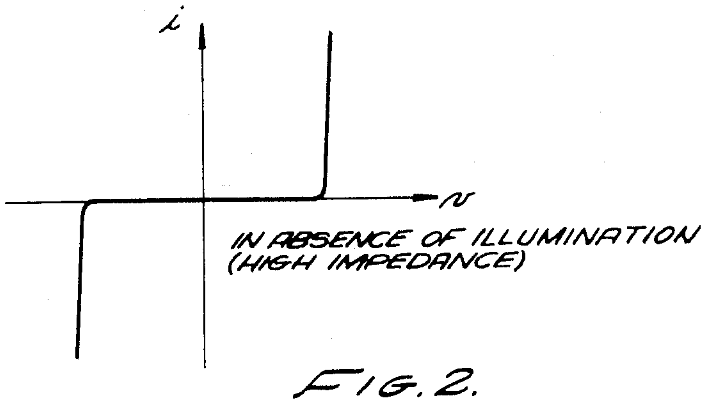
FIGURE 2 is a graph of the characteristic of the solar cells in the absence of illumination.

FIGURE 2 shows graphically that when solar cells 22 and 24 are placed in the dark and lamp 11 is not illuminated, the impedance between output terminals 32 and 34 is very high. This is because each solar cell is essentially a semiconductor diode, and since they are connected back-to-back, a high impedance path is presented to current in either direction.

2

Figure 3:
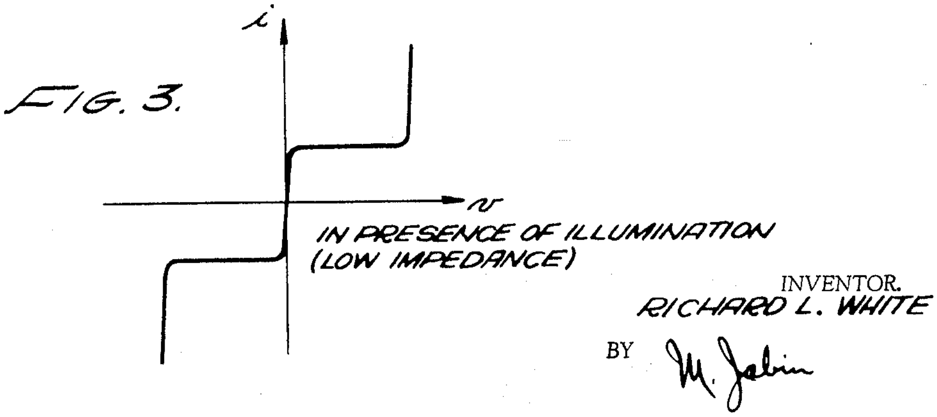
FIGURE 3 is a graph of the characteristic of the solar cells in the presence of illumination.

FIGURE 3 shows graphically that when lamp 11 is illuminated, the impedance between output terminals 32 and 34 is very low. This is because each solar cell, when illuminated, functions as a source of electric potential. Since solar cells 22 and 24 are connected back-to-back, they will produce voltages of opposite polarities and will cancel out each other. The net result will be that output terminals 32 and 34 will in effect be short circuited, and the contact circuit will be energized. As is shown by FIGURES 2 and 3, the circuit of FIGURE 1 has a high open-circiut-to-closed-circuit resistance ratio.

Some of the advantages of this circuit are that the contact circuit is completely isolated electrically from the input circuit and contains no mechanical moving parts. Other advantages are that a relay incorporating this circuit can be made very simple, lightweight, and compact.

While particular embodiments of the present invention have been shown and described, it will be obvious to those skilled in the art that changes and modifications may be made without departing from this invention in its broader aspects, and, therefore, the aim in the appended claim is to cover all such changes and modifications as fall within the true spirit and scope of this invention.

I claim:

A solid state relay comprising: first and second solar cells, each having anode and cathode elements, means coupling an element of said first cell to the like element of said second cell, circuit means connected to the remaining elements of said cells for supplying an external current to said cells, a lamp positioned relative to said cells such that said cells are substantially equally illuminated by said lamp, and an input circuit coupled to said lamp, illumination of said lamp as a result of current passed through said input circuit causing said cells to produce equal but opposite voltages and permitting said external current to pass through said circuit means, said cells acting to block passage of said external current when said lamp is nonilluminated.

References Cited by the Examiner

UNITED STATES PATENTS

| | | | |
|---|---|---|---|
| 2,233,879 | 3/1941 | Tolman | 250—209 X |
| 2,308,095 | 1/1943 | Meeder | 250—212 X |
| 2,482,980 | 9/1949 | Kallmann | 250—211 X |
| 2,740,901 | 4/1956 | Graham | 250—212 X |
| 2,901,669 | 8/1959 | Coleman | 250—212 X |
| 2,949,498 | 8/1960 | Jackson | 136—89 |

RALPH G. NILSON, *Primary Examiner.*

RICHARD M. WOOD, WALTER STOLWEIN, *Examiners.*